United States Patent [19]

Miyata et al.

[11] Patent Number: 4,487,084
[45] Date of Patent: Dec. 11, 1984

[54] PUSH-BUTTON TYPE TUNER

[75] Inventors: Hiroyasu Miyata, Furukawa; Keizo Watanabe; Akio Yamaguchi, both of Iwaki, all of Japan

[73] Assignee: Sanshin Electric Co., Ltd., Japan

[21] Appl. No.: 347,978

[22] Filed: Feb. 11, 1982

[30] Foreign Application Priority Data

Feb. 13, 1981 [JP] Japan ............................. 56-18199[U]

[51] Int. Cl.³ ............................................. F16H 35/18
[52] U.S. Cl. .................................. 74/10.33; 74/10.37; 334/7
[58] Field of Search ................. 74/10.33, 10.37; 334/7

[56] References Cited

U.S. PATENT DOCUMENTS

| | | | |
|---|---|---|---|
| 2,424,845 | 7/1947 | Plensler | 74/10.33 |
| 4,133,214 | 1/1979 | Cicala | 74/10.33 |
| 4,194,403 | 3/1980 | Santoro | 74/10.33 |
| 4,232,560 | 11/1982 | Dellantonio | 74/10.37 |
| 4,331,038 | 5/1982 | Naoi | 74/10.33 |

FOREIGN PATENT DOCUMENTS

| | | | |
|---|---|---|---|
| 48006 | 6/1980 | Japan | 74/10.33 |
| 48008 | 8/1980 | Japan | 74/10.33 |

Primary Examiner—Lawrence J. Staab
Assistant Examiner—Michael J. Gonet
Attorney, Agent, or Firm—Guy W. Shoup; Gerard F. Dunne

[57] ABSTRACT

A push-button type tuner comprises a tuning slide member having a positioning portion on one side edge thereof and being capable of sliding in a predetermined direction, a locking member supporting a cam member and capable of moving in a direction substantially perpendicular; to the sliding direction of said tuning slide member. The cam member includes a cam portion moving with said locking member to fall in engagement with the positioning portion of said tuning slide member and a cam shaft connected to said cam portion and inserted between said locking member and a pressing member, and said pressing member moves with said locking member to press the cam member toward the locking member and hold the cam member between the pressing member and the locking member, wherein a receiving portion for receiving the periphery of the cam portion of said cam member is formed in the locking member on the side corresponding to the action point of the pressing member and the cam member is held between the action point of the pressing member and said receiving portion. In this tuner, the stability of the state of locking of the cam member is highly improved and a high reliability is attained without any shear in tuning.

7 Claims, 10 Drawing Figures

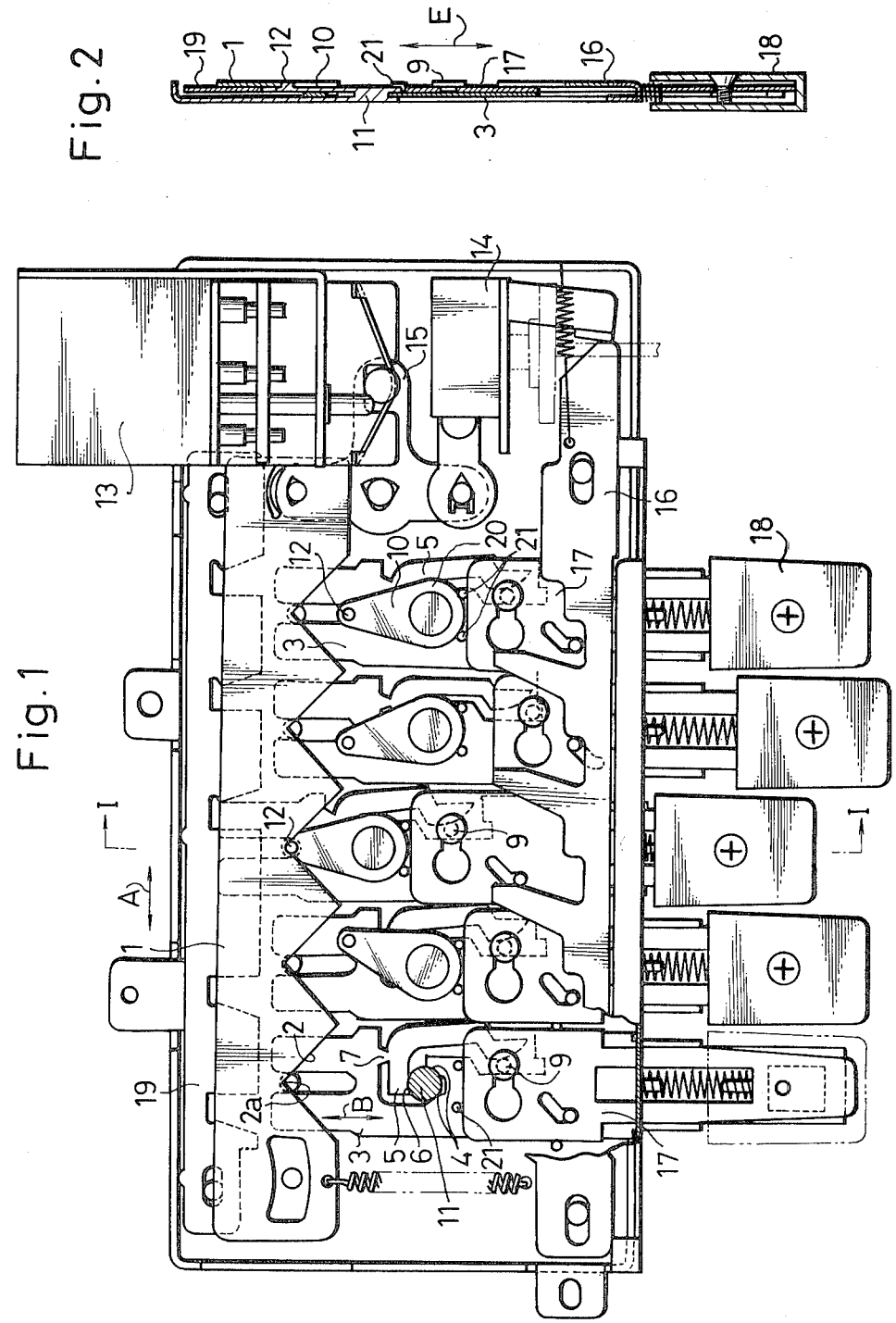

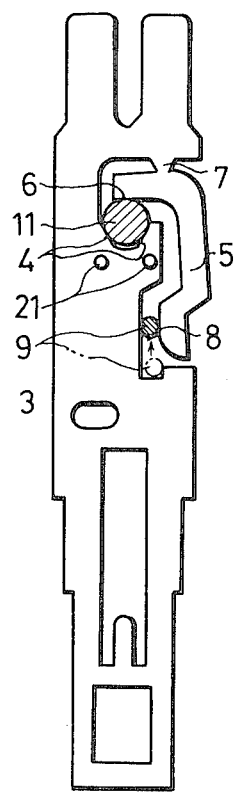
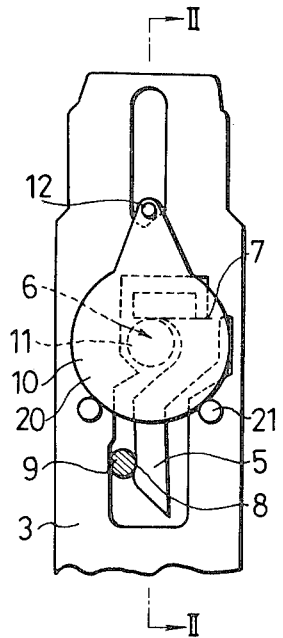
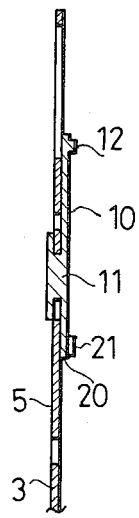
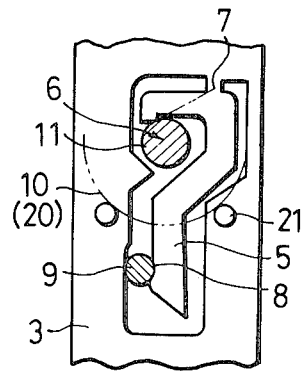
Fig. 3　Fig. 4　Fig. 5
Fig. 6

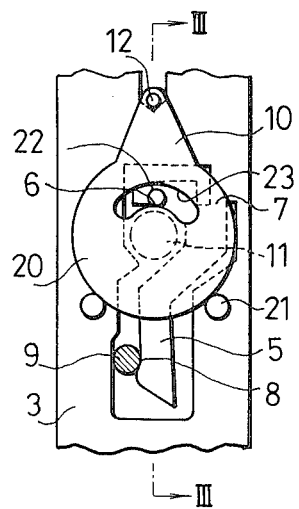
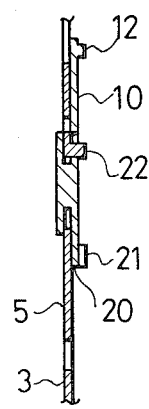
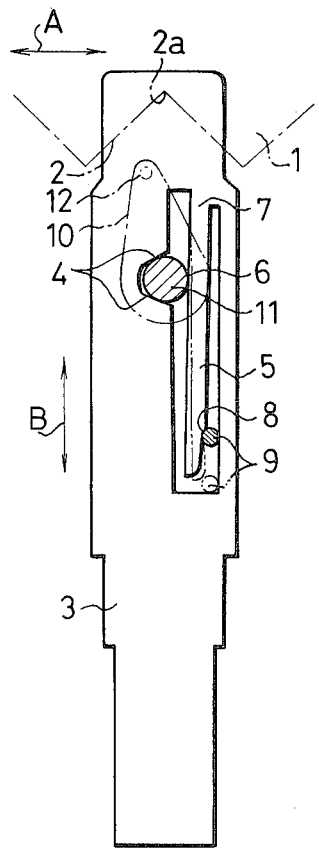
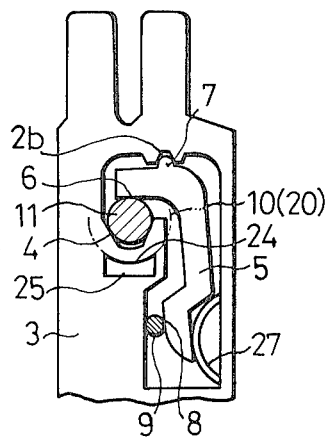

PUSH-BUTTON TYPE TUNER

BACKGROUND OF THE INVENTION

1. Field of the Invention

The present invention relates to a push-button type tuner comprising a tuning slide member co-operating with a tuning core, a rotatable cam member engageable with said tuning slide member and lock means for positioning the cam member in the rotation direction thereof. More particularly, the present invention relates to a pushbutton type tuner having improved lock means.

2. Description of the Prior Art

Lock means of a cam member in the conventional pushbutton type tuner will now be described with reference to FIG. 10.

A plurality, for example, five, of V-grooves 2 are consecutively formed on one side edge of a tuning slide plate 1 capable of sliding in the direction indicated by arrow A co-operatively with a tuning core (not shown). On the front side of the V-grooves 2, a locking slide plate 3 is arranged so that it can move in the direction indicated by arrow B, which is rectangular to the sliding direction A of the tuning slide plate 1.

At a predetermined position of the locking slide plage 3, a cam bearing portion 4 having a V-groove shape expanded to the right in the drawings in arranged, and on the right side of the cam bearing portion 4, an action point 6 of a lever piece 5 is mounted with a certain space from the cam bearing portion 4. The top end portion of the lever piece 5 is connected to the locking slide plate 3 to form a fulcrum 7. The free end of the lever piece 5 acts as the force point, and in the vicinity of this free end, a locking pin 9 capable of moving in the direction of arrow B is inserted.

A cam shaft 11 connected to the lower face of a cam 10 is inserted between the cam bearing portion 4 of the locking slide plate 3 and the action point 6 of the lever piece 5. An engaging projection 12 is formed on the top end portion of the cam 10 so that it falls in abutting contact with the V-groove 2 of the tuning slide plate 1.

Before the presetting operation is performed, the locking slide plate 3 is pulled to the innermost position, and the locking pin 9 and lever pieces 5 are located at the positions indicated by dotted lines and the action point 6 of the lever piece 5 is separated from the cam shaft 11. Accordingly, the cam shaft 11 is not held between the cam bearing portion 4 and the action point 6 but the cam 10 is kept rotatable.

If the locking slide plate 3 is slid toward the tuning plate 1 in this state, the engaging projection 12 of the cam 10 is first caused to abut against the inclined portion of the V-groove 2 of the tuning sliding plate 1 preliminarily positioned by the manual operation. When the locking slide plate 3 is further advanced, the engaging projection 12 is guided by the inclined portion of the V-groove 2 while the cam 10 is being rolled, and the projection 12 is brought into abutting contact with the bottom 2a of the V-groove 2. If the locking slide plate 3 is further pushed in this state, the locking pin 9 is pushed on the side of the force point 8 of the lever piece 5, and the lever piece 5 is bent toward the cam bearing portion 4 with the fulcrum 7 being as the center as indicated by a solid line in the drawings and the cam shaft 11 is held between the cam bearing portion 4 and the action point 6. Thus, positioning of the cam 10 in the direction of rotation is accomplished and the presetting operation is completed.

When a preset station is selected, the locking slide plate 3 which has been cam-locked in the above-mentioned manner is pressed toward the tuning slide plate 1 kept in a freely slidable condition. By this pushing operation, the engaging projection 12 of the cam 10 is brought into contact with the inclined portion of the V-groove 2 of the tuning slide plate 1, and if the locking slide plate 3 is pushed, the engaging projection 12 arrives at the bottom 2a of the V-groove 2 while the tuning slide plate 1 is slid, whereby positioning of the tuning slide plate 1 is effected. Even if the locking slide plate 3 is further pushed in this state, the engaging projection 12 is not advanced any longer though the engaging projection 12 is strongly pressed to the bottom 2a of the V-groove 2. The tuning core is moved with the above-mentioned sliding movement of the tuning slide plate 1 and a desirable frequency is set.

In the above-mentioned conventional tuner, positioning of the cam 10 in the direction of rotation is effected by holding the cam shaft 11 between the cam bearing portion 4 and the action point 6 of the lever piece 5. The diameter of the cam shaft 11 is restricted to some extent by the width of the locking slide plate 3 or the lever piece 5 and it is not allowable to increase the diameter of the cam shaft 11 beyond a certain limit. Accordingly, in the conventional structure where positioning of the cam 10 is effected by holding the cam shaft 11 having a relatively small diameter between the cam bearing portion 4 and the action point 6, the engaging projection 12 formed on the top end portion of the cam 10 is apt to totter and shear in tuning is often caused. Accordingly, the conventional structure involves a problem concerning the reliability.

If the diameter of the cam shaft 11 is increased, the cam 10 is held relatively stably. However, since the width of the locking slide plate 3 or the lever piece 5 should be reduced for compensating the increased diameter of the cam shaft 11, the mechanical strength of the locking slide plate 3 or the lever piece 5, especially the force for holding the cam shaft 11, is reduced and undesirable results are often observed.

SUMMARY OF THE INVENTION

It is therefore a primary object of the present invention to provide a push-button type tuner in which the above-mentioned defects of the conventional techniques are eliminated and a high reliability is attained without shear in tuning.

In accordance with one fundamental aspect of the present invention, this object of the present invention can be attained by a push-button type tuner comprising a tuning slide member having a positioning portion, such as a V-groove, on one side edge thereof and being capable of sliding in a predetermined direction, a locking member for supporting a cam member at a predetermined position, such as a locking slide plate, which is capable of moving in a direction substantially rectangular to the sliding direction of said tuning slide member, said cam member including a cam portion moving with said locking member to fall in engagement with the positioning portion of said tuning slide member and a cam shaft connected to said cam portion and inserted between said locking member and a pressing member, such as a lever piece, and said pressing member moving with said locking member to press the cam member toward the locking member and hold the cam member between the pressing member and the locking member, wherein a receiving portion, such as a pin, for receiving the periphery of the cam portion of said cam member is formed in the locking member on the side corresponding to the action point of the pressing member and the cam member is held between the action point of the pressing member and said receiving portion.

In accordance with another fundamental aspect of the present invention, there is provided a push-botton type tuner comprising a tuning slide member having a positioning portion on one side edge thereof and being capable of sliding in a predetermined direction, a locking member being capable of moving in a direction substantially rectangular to the sliding direction of said tuning slide member and having a cam member receiving portion at a predetermined position, a cam member moving with said locking member to fall in engagement with the positioning portion of said tuning slide member, and a pressing member moving with said locking member to press at least a part of the cam member to the cam member receiving portion of the locking member and thus hold the cam member between the pressing member and the cam member receiving portion of the locking member, wherein a bearing part of the cam member receiving portion of the locking member and a cam member pressing portion of said pressing member are arranged in a direction substantially rectangular to the sliding direction of said tuning slide member.

BRIEF DESCRIPTION OF THE DRAWINGS

FIG. 1 is a partially cut-out plan view illustrating one embodiment of the push-button type tuner according to the present invention.

FIG. 2 is a view showing the section taken along the line I—I in FIG. 1.

FIG. 3 is a plan view showing a locking slide plate to be used for the tuner shown in FIG. 1.

FIGS. 4, 6, 7 and 9 are plan views showing the main parts of another embodiments of the push-button type tuner according to the present invention.

FIG. 5 is a view showing the section taken along the line II—II in FIG. 4.

FIG. 8 is a view showing the section taken along the line III—III in FIG. 7.

FIG. 10 is a plan view showing the main part of the conventional push-button type tuner.

DETAILED DESCRIPTION OF THE PREFERRED EMBODIMENTS

The present invention will now be described in detail with reference to embodiments illustrated in the accompanying drawings.

Referring to FIGS. 1 through 3 illustrating one embodiment of the present invention, reference numerals 13 and 14 represent a tuning member having a tuning core arranged movably therein and a manual station-selecting member having clutch means arranged therein and being connected to a knob portion, respectively, and a T-shaped connecting plate 15 is disposed to cooperate a tuning slide plate 1 with the tuning member 13 and the manual station-selecting member 14 and a release lever 16 is disposed co-operatively with the clutch menas of the manual station-selecting member 14. An arm slide 17 is arranged on a locking slide plate 3 so that the slide 17 can slide in the direction indicated by an arrow B. Reference numerals 18 and 19 represent a push button and a slide plate for changeover between AM broadcast and FM broadcast.

The locking slide plate 3 is formed of a steel spring plate, and a cam bearing portion 4 having a shape of a V-figured groove expanded toward the tuning slide plate 1 is formed at a predetermined position of the locking slide plate 3. A lever piece 5 having a substantially L-shaped plane is integrally connected to the locking slide plate 3 at a fulcrum 7, and an action point 6 of the lever piece 5 is located at a position closer to the tuning slide plate 1 in the cam bearing portion 4. Accordingly, the direction of arrangement of the cam bearing portion 4 of the locking slide plate 3 and the action point 6 of the lever piece 5, that is, the direction of holding a cam shaft 11, is substantially the same as the moving direction B of the locking slide plate 3 and is substantially rectangular to the sliding direction A of the tuning slide plate 3.

The cam shaft 11 is rotatable inserted and supported between the cam bearing portion 4 and the action point 6, and a cam 10 having an engaging projection 12 formed on the top end thereof is integrally connected to the upper portion of the cam shaft 11. On the front side of the cam 10, that is, on the side opposite to the engaging projection 12, an arcuate peripheral portion 20 coaxial with the cam shaft 11, which has a radius larger than that of the cam shaft 11, is arranged. The diameter of the arcuate peripheral portion 20 may be increased within the range where it does not impinge against other members. A plurality, for example, two, of receiving pins 21 are implanted on the top face of the locking slide plate 20 at a position confronting the arcuate peripheral portion 20 of the cam 10, with a certain space being left between the two receiving pins 21.

In the above-mentioned structure, if a locking pin 9 is pressed to the force point 8 of the lever piece to bend the lever piece 5, the arcuate peripheral portion 20 of the cam 10 and the cam shaft 11 are pressed toward the pins 21 and the cam bearing portion 4, respectively, whereby the cam 10 and cam shaft 11 are held among the cam bearing portion 4, the receiving pins 21 and the action point 6 of the lever piece 5.

FIGS. 4 and 5 illustrate another embodiment of the present invention, and FIG. 6 illustrates still another embodiment of the present invention. These embodiments are different from the above-mentioned first embodiment in the following two points. In the first place, the cam bearing portion 4 is not arranged on the locking slide plate 3, and the cam 10 is held between the action point 6 of the lever piece 5 and the receiving pins 21. In the second place, the positional relationship between the action point 6 and fulcrum 7 of the lever piece 5 is changed so that the pressing force to the cam shaft 11 at the action point 6 is directed to the center of the cam shaft 11, as indicated by an arrow. By adoption of such arrangement, the stability of the locking state is further enhanced.

FIGS. 7 and 8 illustrate a further embodiment of the present invention. In this embodiment, a pressing pin 22 extended toward the cam 10 is mounted on the top face of the lever piece 5 and an arcuate fitting groove 23 is formed on the cam 10 at a position confronting the pressing pin 22.

While the cam 10 is not locked, the pressing pin 22 is freely fitted in the fitting grove 23, and the cam 10 is kept rotatable. When a stopper pin 9 is pushed toward the force point 8 of the lever piece 5, the lever piece 5 is bent and the pressing pin 22 is pressed against the front edge of the fitting groove 23, whereby the cam 10 is held between the pressing pin 22 and the receiving pin 21.

FIG. 9 illustrates a still further embodiment of the present invention. In this embodiment, instead of the above-mentioned receiving pin 21, a receiving stand 25 having a concave surface 24 having a radius of curvature substantially equal to or slightly larger than that of the arcuate peripheral portion 20 of the cam 10 is disposed integrally with the locking slide plate 3.

Furthermore, the lever piece 5 is formed independently from the locking slide plate 3, and the fulctrum 7 of the tever piece 5 is rotatably fitted in a concave dent portion 26 formed on the locking slide plate 3. A return spring 27 is disposed in the vicinity of the force point 8 of the lever piece 5 so that when the cam 10 is released from locking, the lever piece 5 is returned to the original position by the return spring 27.

As will be apparent from the foregoing description, in the present invention having the above-mentioned structure, since the periphery of the cam member is received and held when it is locked, the state of locking of the cam member is highly stabilized without reduction of the mechanical strength of the locking member or pressing member. Accordingly, there can be provided a pushbutton type tuner having a high reliability in which shear in tuning is not caused to occur.

What is claimed is:

1. A push-button tuner having a slide member movable longitudinally during tuning of said tuner; a locking member movable perpendicularly to the longitudinal movement of said slide member; said locking member carrying a pivotal cam member having a shaft portion fitting within a groove of said locking member, a cam portion adapted to ride along in inclined portion formed in a side edge of said slide member and a main body portion concentric with said shaft portion but having a larger diameter; and means for holding said cam member in a pivotal position placing said cam portion in a home position on said slide member when said slide member is in a position corresponding to a desired tuning condition of said tuner; said holding means including a receiving portion carried by said locking member and adapted to engage the main body portion of said cam member and a pressing member carried by said locking member and movable into engagement with said shaft portion for urging the main body portion of said cam member against said receiving portion.

2. A tuner according to claim 1, said locking member being movable inwardly of said tuner, and said groove receiving said shaft portion opening in the direction of inward movement of said locking member, said receiving portion being adapted to engage portions of said main body portion facing in the direction of outward movement of said locking member and said pressing member being movable into engagement with portions of said shaft portion facing in the direction of inward movement of said locking member so that said cam member is tightly held by gripping forces having a major component parallel to the path of movement of said locking member.

3. A tuner according to claim 2, said pressing member being generally L-shaped with one leg portion being adapted to engage said shaft portion.

4. A tuner according to claim 3, said pressing member being connected integrally to said locking member at a location spaced from the end portion of said one leg portion.

5. A tuner according to claim 3, said pressing member being formed separately from said locking member, but being pivotally held thereto at a fulcurm point spaced from the end portion of said one leg portion, and including means resiliently biasing said end portion away from said shaft portion.

6. A push-button switch tuner having a slide member movable longitudinally during tuning of said tuner, a locking member movable perpendicularly to the longitudinal movement of said slide member and carrying a pivotal cam member having a cam portion adapted to ride along an inclined portion formed in a side edge of said slide member, and means for holding said cam in a pivotal position placing said cam portion in a home position on said slide member when said slide member is in position corresponding to a desired tuning condition of said tuner, said holding means including a receiving portion carried by said locking member and adapted to engage a portion of said cam member and a pressing member carried by said locking member and movable into engagement with said cam member for holding said cam member tightly between forces applied by said receiving portion and said pressing member, said forces having a major component generally parallel to the direction of movement of said locking member.

7. A tuner according to claim 6, said cam member including a shaft portion for mounting said cam member pivotally to said locking member, the portions of said cam member adapted to be engaged by said receiving portion being concentric with said shaft portion but having a larger diameter.

* * * * *